(12) United States Patent
Yamada et al.

(10) Patent No.: US 6,594,149 B2
(45) Date of Patent: Jul. 15, 2003

(54) LIQUID COOLED CIRCUIT DEVICE

(75) Inventors: Kazuji Yamada, Hitachi (JP); Akihiro Tamba, Hitachinaka (JP); Takayoshi Nakamura, Hitachi (JP); Ryuichi Saito, Hitachi (JP); Toshio Ogawa, Hitachinaka (JP); Hisanori Okamura, Tokai (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/099,995

(22) Filed: Mar. 19, 2002

(65) Prior Publication Data

US 2003/0053294 A1 Mar. 20, 2003

(30) Foreign Application Priority Data

Sep. 18, 2001 (JP) .......................... 2001-282543

(51) Int. Cl.[7] .................................. H05K 7/20
(52) U.S. Cl. .................. 361/699; 165/170; 257/714; 361/715
(58) Field of Search .................. 228/112.1, 114.5; 165/80.3, 80.4, 104.33, 168, 185, 170; 257/713, 714; 363/141; 29/890.03; 361/679, 699, 707–713, 715–722, 784

(56) References Cited

U.S. PATENT DOCUMENTS 3,722,080 A * 3/1973 Sato ........................... 29/882
6,367,152 B1 * 4/2002 Kataoka .................. 29/890.03
2002/0153130 A1 * 10/2002 Okamoto

FOREIGN PATENT DOCUMENTS

JP 09-323015 * 6/1999
JP 2001-034965 * 8/2001

* cited by examiner

Primary Examiner—Gerald Tolin
(74) Attorney, Agent, or Firm—Antonelli, Terry, Stout & Kraus, LLP

(57) ABSTRACT

A liquid-cooled circuit device including: a module having a circuit element and a module base plate on surface of which the circuit element is mounted; a circuit case for accommodating the module; and a cooling liquid chamber for flowing a cooling liquid in contact with a back face of the module base plate of said module. The module base plate of the module is fitted into an opening provided in a member forming the cooling liquid chamber and welded without a gap.

17 Claims, 13 Drawing Sheets

LIQUID COOLED CIRCUIT DEVICE

BACKGROUND OF THE INVENTION

The present invention relates to a liquid-cooled circuit device comprising a module of which circuit elements are mounted on a module base plate and in which the module is cooled by cooling liquid, and a method for manufacturing the liquid-cooled circuit device.

In an electronic circuit device having a power circuit element whose heat emission is high, such as an inverter device for controlling a driving motor of an electric vehicle, liquid cooling using a liquid having a greater thermal capacity is effective from the need to efficiently carry out cooling of the power circuit element. For prior art liquid cooling of a power circuit element, a direct heat transfer system by which a power circuit element is directly immersed in an electrically insulating cooling liquid and an indirect heat transfer system by which a circulating cooling liquid is brought into contact with a circuit case in which a power circuit element is mounted and the power circuit element is cooled by cooling the circuit case are mainly used.

However, the direct heat transfer system has a disadvantage of involving many incidental problems regarding leak, disposal and safety of special cooling liquid that is used. In the indirect heat transfer system, when the power circuit element is mounted in the circuit case, grease or the like has to be inserted between them to ensure heat transfer, and this leads to a disadvantage of poor cooling efficiency because the inserted substance obstructs heat radiation of the power circuit element.

As a way to obviate this disadvantage of the indirect heat transfer system, it is readily conceivable to mount the power circuit element on a base plate (hereinafter a device on which a power circuit element is mounted shall be referred to as a power module) and to bring the cooling liquid into contact with the other face (to be referred to as the back face) of the opposite to that on which the element is mounted, which would result in efficient cooling of the power circuit element. In this case, it is required to provide an opening in the circuit case and to close the opening by pressing the back face of the module base plate against the opening to bring the cooling liquid into direct contact with the back face of the module base plate. If there is any gap in the contacting part of the back face of the module base plate pressed against the circuit case opening, the cooling liquid will enter through the gap into the circuit case to cause the module and electronic circuits in the circuit case to be immersed in the cooling liquid and thereby invite erroneous actions by the electronic device.

Then, in order to resolve this problem, a solution is proposed in JP-A-11-163572 specification, according to which the module base plate and the cooling liquid case are joined with screws or the like, and an O-ring is provided inside to seal any gap between them, so that even if the cooling liquid in the cooling liquid case leaks, the leaked liquid will not directly enter the circuit case but will be discharged into the atmosphere.

However, the technique described in JP-A-11-163572 specification requires a portion on the module base plate for mounting the O ring, screws and so forth, and therefore involves the problem that size of the module base plate becomes large. Such an enlarged module base plate not only adds to the cost, because the module base plate itself is rather expensive essentially, but also, where a large number of power modules are to be mounted, the spacing between the power circuit elements would be expanded, resulting in an increased size of the whole device.

In view of these problems of the prior art, an object of the present invention is to provide a liquid-cooled circuit device contributing to preventing the module base plate from expanding in size and the cooling liquid from infiltrating into the circuit case, and a manufacturing method for such a circuit element device.

BRIEF SUMMARY OF THE INVENTION

A liquid-cooled circuit device according to a first aspect of the present invention, comprising: a module comprising a module base plate and a circuit element mounted on the module base plate; a circuit case for housing the module; a cooling case through which cooling liquid flows, said cooling liquid being in contact with a back face of the module base plate; and a module supporting having an opening for accommodating the module base plate therein; wherein said module base plate is placed into said opening of said module supporting plate, edges of the opening and the module base plate are joined by welding to each other without a gap therebetween; said circuit case is formed with an opening smaller than said module supporting plate; said module supporting plate is fixed to the circuit case so as to block said opening in said circuit case from outside the circuit case and to cause said circuit element of said module mounted on the module supporting plate to be positioned within the circuit case; said cooling case is formed with a recess forming a cooling liquid chamber through which the cooling liquid flows; and said cooling case is fixed to said circuit case so that said recess faces said module supporting plate.

With the structure described above, the module base plate and the module supporting plate can be regarded as an integrated structure by welding, there is no conceivable risk of liquid leakage from between them. Furthermore, since the module supporting plate is greater in size than the opening in the circuit case and blocks the opening from outside the circuit case, even if the cooling liquid leaks from between the supporting plate and the circuit case, the leaked liquid will be discharged outside instead of entering the circuit case and soaking circuit elements, base plates and wiring arranged in the circuit case because a connecting portion between them are positioned outside the circuit case. Further, as the back face of the module base plate faces the inside of the cooling case from the opening in the module supporting plate, the back face of the module base plate is in direct contact with the cooling liquid in the cooling case to efficiently cool the module. Moreover, since the module base plate is joined to the module supporting plate by welding, there is no need for the module base plate to be provided with any O ring for sealing or screws for connection, making it easier to reduce the size of the module base plate. Furthermore, since the module is mounted inside the circuit case, terminal wiring to the control circuit is simplified. To add, while welding usually means a method of melting the parts to be joined, and has such versions as arc welding, laser welding, electron beam welding and the like, there are methods by which the parts to be joined are not melted, such as soldering, brazing, friction stir welding and the like. In present specification, "welding" is as a generic term for both categories of joining methods. It has to be noted, however, that welding of a module base plate on which a circuit element is mounted should preferably be accomplished by a friction stir welding method to minimize the thermal impact on the circuit element and other members.

A liquid-cooled circuit device according to a second aspect of the invention, comprising: a module comprising a module base plate and a circuit element mounted on the module base plate; a circuit case for housing the module; and a cooling case through which cooling liquid flows, said cooling liquid being in contact with a back face of the module base plate; wherein said circuit case is formed with an opening; said cooling case is formed with a recess forming a cooling liquid chamber through which said cooling liquid passes; the module base plate is arranged so that the circuit element of the module be positioned inside the circuit case, and joined by welding to either an edge of the opening in said circuit case or an edge of an opening of said recess of said cooling case without a gap therebetween; and said cooling case is fixed to the circuit case so that said recess faces toward said opening in said circuit case.

With the structure described above, the module base plate and the edge of the opening in the circuit case or the module base plate and the edge of the opening in the cooling case form a structure integrated by welding, and accordingly there is no conceivable risk of liquid leakage from between them. In other words, the inside of the circuit case to which the module base plate is fitted is in a completely sealed state. Therefore, there is no risk of cooling liquid leaked from inside the cooling case to enter the circuit case. Also, similar to the liquid-cooled circuit device according to the first aspect of the invention, the present device can also cool the module efficiently, and makes it easier to reduce the size of the module base plate. Furthermore, this structure allows the number of parts to be reduced than the first embodiment of the liquid-cooled circuit device.

A liquid-cooled circuit device according to a third aspect of the invention, comprising: a module comprising a module base plate and a circuit element mounted on the module base plate; and a circuit case for housing the module; wherein: the module base plate is placed within said circuit case so as to partition inside of the circuit case into two chambers, and is joined to an inner face of the circuit case by welding without a gap therebetween; one of the two chambers formed in said circuit case, on the side where the circuit element of the module is present, forms a circuit accommodating chamber and the other forms a cooling liquid chamber; and said cooling liquid chamber is formed with an inlet and outlet for cooling liquid flowing in contact with a back face of the module base plate of the module.

Also with this structure, in dividing the inside of the circuit case by the module base plate, it is joined by welding to the inner face of the circuit case without a gap therebetween, so that the cooling liquid from one of the two chambers, i.e. the cooling liquid chamber, does not enter the other chamber, the circuit accommodating chamber. Moreover, this structure dispenses with sealing members such as O rings and connecting members such as screws, resulting in an even smaller number of parts.

Moreover, in the third embodiment of the liquid-cooled circuit device, if some of the parts forming the cooling liquid chamber among the case forming parts constituting the circuit case are detachably fixed to the rest of the case forming parts, maintenance and other tasks can be accomplished with greater ease though the number of parts somewhat increases.

A method for manufacturing a circuit element device to achieve the object is characterized in that a base plate on which a circuit element is mounted and other member are joined by a friction stir welding method utilizing a plastic flow due to friction heat generated by rotation of a rotary tool. It is preferable here for the base plate and the other member to contain the same metallic element.

A circuit element device for achieving the object is characterized in that a base plate on which a circuit element is mounted and other member are joined to each other by welding, and crystal grains in parts joined by welding are smaller than the original crystal grains of the respective members. A liquid-cooled circuit device comprising: a module having a circuit element and a module base plate on surface of which the circuit element is mounted; a circuit case for accommodating said module; and a cooling liquid chamber for flowing a cooling liquid in contact with a back face of said module base plate of said module, wherein said module base plate of said module is fitted into an opening provided in a member forming said cooling liquid chamber and welded without a gap.

Other objects, features and advantages of the invention will become apparent from the following description of the embodiments of the invention taken in conjunction with the accompanying drawings.

DETAILED DESCRIPTION OF THE INVENTION

Figure 1:
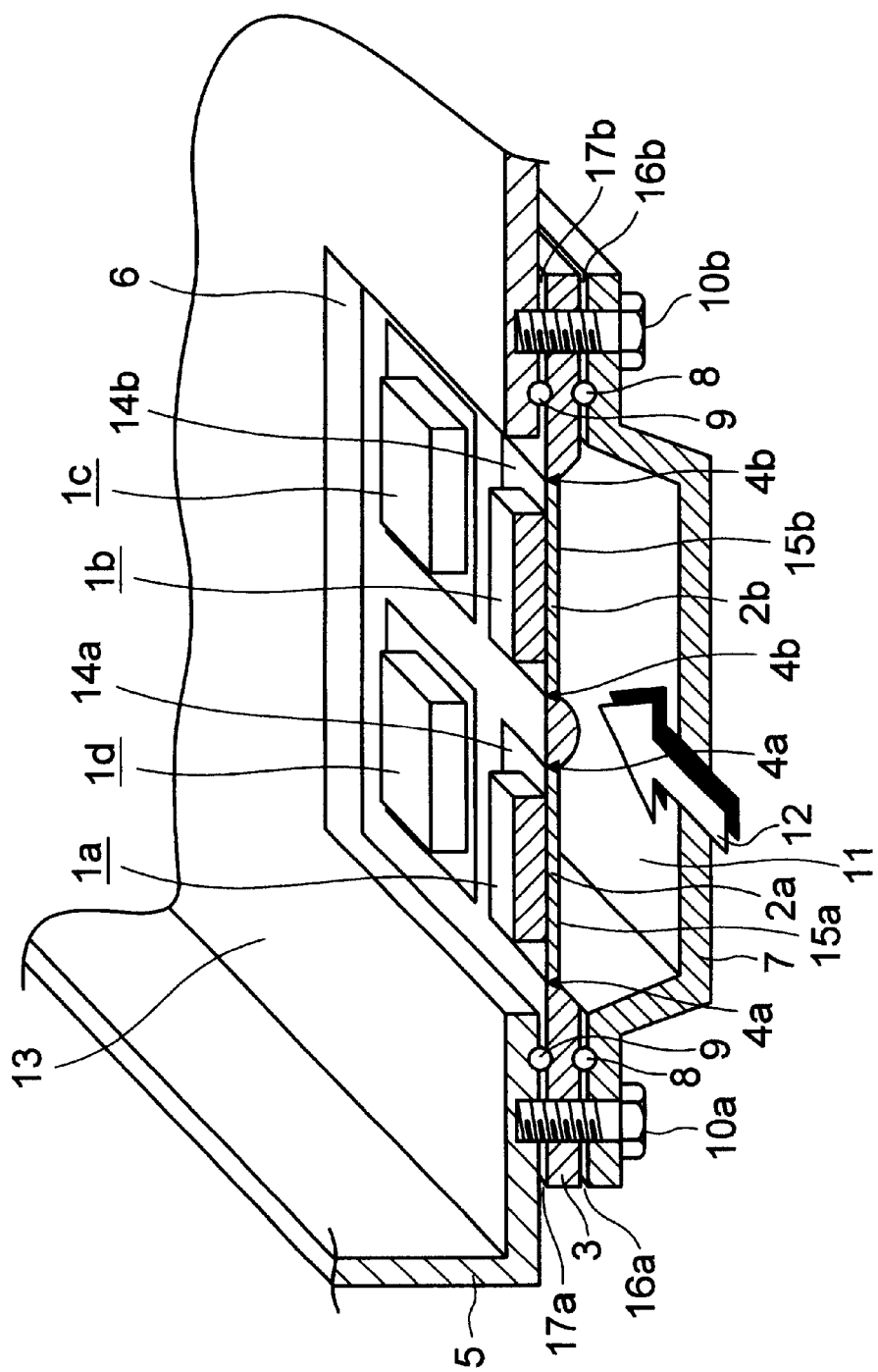
FIG. 1 is a cut out perspective view of an essential part of a first embodiment of a liquid-cooled circuit device according to the invention.

Various embodiments of a liquid-cooled circuit device of the present invention will be described hereinafter with reference to accompanying drawings.

First, a first embodiment of a liquid-cooled circuit device of the invention will be described with reference to FIGS. 1 and 2. For this and all the following embodiments and any variation thereof, the same constituent elements will be assigned respectively the same reference numerals, and duplication of description will be avoided. If any one embodiment or one variation has a plurality of members of the same kind, the same numeral will be assigned to them, differentiated by different small alphabetical letters suffixed to the numeral.

In FIG. 1, reference numerals 1a through 1d denote power circuit elements; 2a and 2b, module base plates on which the power circuit elements 1a and 1b are mounted, respectively; 3, a module supporting plate to which the module base plates 2a and 2b are fixed; 4a and 4b, welded portions between the power module base plates 2a and 2b, and the module supporting plate 3; 5, a circuit case; 6, an opening provided in the circuit case 5; 7, a cooling case; 8, a sealing member (e.g. an O ring) for sealing a gap between the cooling case 7 and the module supporting plate 3; 9, a sealing member (e.g. an O-ring) for sealing a gap between the circuit case 5 and the module supporting plate; 10a and 10b, bolts for fastening the circuit case 5, the module supporting plate 3 and the cooling case 7 together; 11, a cooling liquid chamber in the cooling case 7 for letting a cooling liquid pass; 12, the cooling liquid; 13, the inside of the circuit case 5; 14a and 14b, element mounting faces (front faces) of the module base plates 2a and 2b, respectively; and 15a and 15b, the other faces (back faces) opposite to the module mounting faces.

Each of the power circuit elements 1 is provided inside with a power device including an insulated gate bipolar transistor (IGBT), which is a heat generating element. The power circuit element 1 is mounted on, and electrically insulated from, the element mounting face 14 of the module base plate 2 to minimize a thermal resistance between the power circuit element 1 and the base plate 2. In the present arrangement, electrical insulation is achieved by adhering a highly heat-conductive material, such as AlN ceramics, onto the element mounting face 14 of the base plate 2, and the power circuit element 1 is soldered onto an electrode pattern formed over that face to constitute the power module.

The module supporting plate 3 is formed with a plurality of openings matching the size of the module base plates 2, and the module base plates 2 are fitted into the openings. The edges of the openings and outer edges of the module base plates 2 are joined by welding without a gap therebetween.

Figure 13:
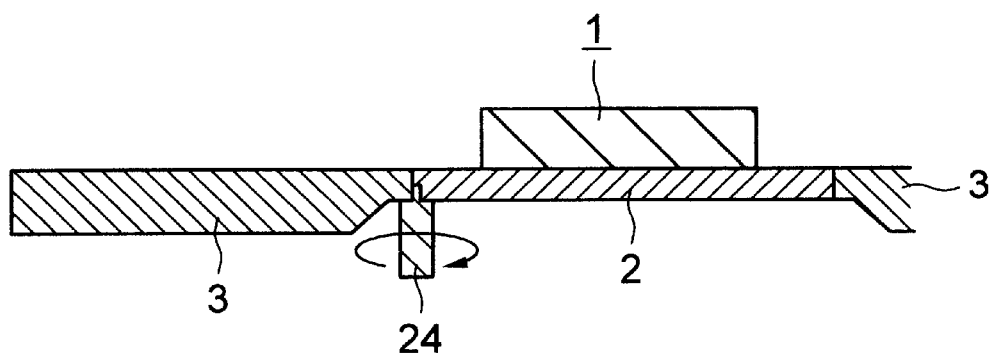
FIG. 13 is a view showing a friction stir welding method.

The welding is done by a method known as friction stir welding (FSW). By the present method, as illustrated in FIG. 13, a rotary tool, which is turning, is inserted to a prescribed depth between members to be joined, in this case between the edges of openings in the module supporting plate 3 and the external edges of the module base plate 2, and the rotary tool, kept turning, is shifted in relative position in a direction of a joint line to plastically fluidize the members to be jointed by friction heat between them so that the members can be joined to each other with only local heat at a low temperature not higher than the melting point of the members to be joined (heating by friction). The crystal grains of the portion welded by the method, unlike in those resulting from laser beam welding, arc beam welding or the like, are smaller than the original crystal grains of the welded members. This welding method, as it requires only local heating at relatively low temperature, can avoid adverse effects such as mechanical distortion of the module base plates, deterioration of insulation and other electrical ill effects and the like, namely various adverse effects of heat on the power modules. This welding method, as it gives rise neither metal vapor nor metal powder, has another advantage of being able to avoid contamination of the power modules in the welding process. In the present embodiment of the invention, the module supporting plate 3 and the module base plates 2 are formed of Al alloy or AlSiC alloy, both being excellent in heat transfer performance and suitable for FSW.

As described above, welding of the plurality of power modules onto the module supporting plate 3 results in integration of the plurality of power modules. The size of the module supporting plate 3 is greater than that of the opening 6 of the circuit case 5. The module supporting plate 3 is set onto the circuit case 5 from outside the circuit case 5 so that the power modules mounted on the plate 3 face the inside 13 from the opening 6 of the circuit case 5. Further, the cooling case 7 is set onto the module supporting plate 3 on the reverse side to the circuit case 5. The bolts 10a and 10b are screwed into the circuit case 5, the module supporting plate 3 and the cooling case 7 to be connected and fixed to one another. On the side closer to the power circuit elements than the bolts 10 between respective members are inserted the sealing members 8 and 9, such as O rings, all around the circumference of each. In the inside 13 of the circuit case 5, a control circuit for the power module, a power supply circuit therefor and their base plates are housed, though not shown.

Figure 2:
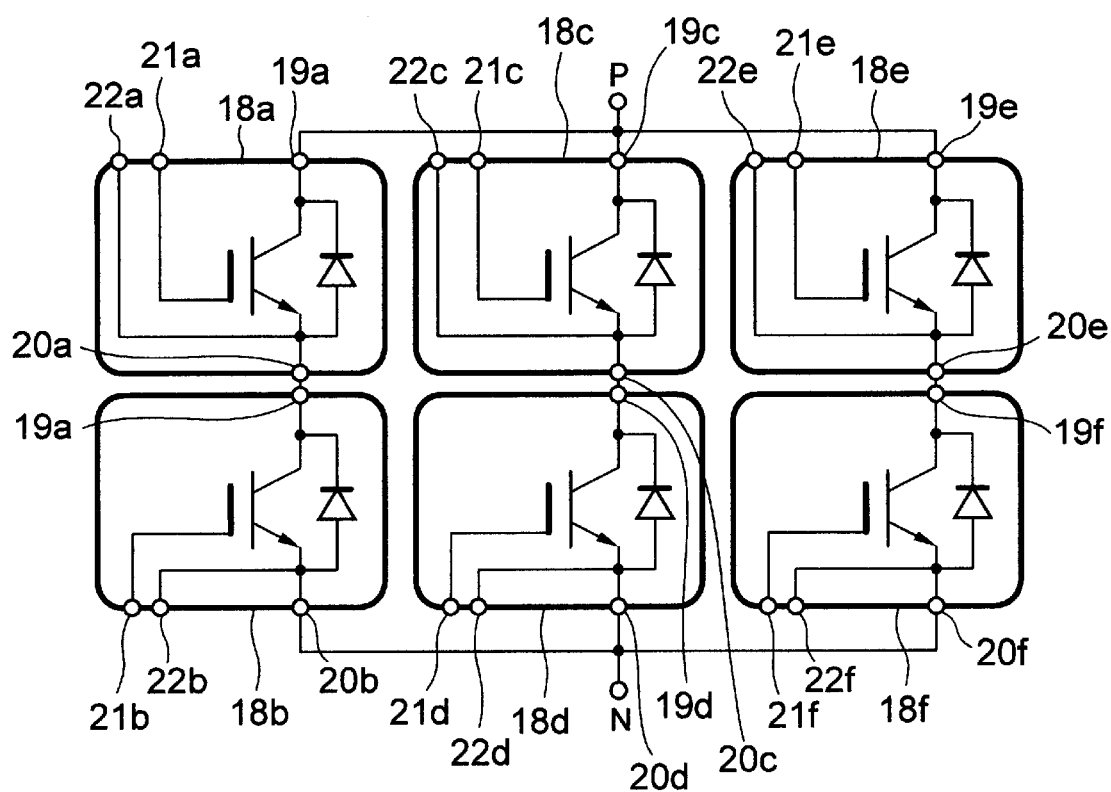
FIG. 2 is a view of a typical circuit of a power module portion of the first embodiment of the liquid-cooled circuit device of the invention.

In the present embodiment, the plurality of power modules, as shown in FIG. 2, constitute a three-phase inverter circuit. In the drawing, reference letter P denotes a plus D.C. power source; N, a minus D.C. power source; 18a through 18f, arms each comprising an IGBT and a diode; 19a through 19f, collectors; 20a through 20f, emitters; 21a through 21f, gates; and 22a through 22f, auxiliary emitters. The three-phase inverter circuit is structured by six arms in total. Where one of the power circuit elements 1 constitutes one of the arms in FIG. 2 (any one of 18a through 18f), a three-phase inverter is formed by the welding and mounting of six power modules onto the module supporting plate 3. Where power circuit elements 1 constitute two arms in FIG. 2 (for instance 18a and 18b), a three-phase inverter is formed by the welding and mounting of three power modules onto the module supporting plate 3. Obviously, where power circuit elements 1 constitute six arms in FIG. 2 (for instance 18a through 18f), a three-phase inverter is formed by the welding and mounting of one power module onto the module supporting plate 3. This configuration of a three-phase inverter circuit by a single module supporting plate contributes to the convenience of use of the present circuit.

One three-phase inverter circuit controls one three-phase motor. For this reason, if a given system requires a plurality of motors, the three-phase inverter circuits corresponding to the numbers of the motor have to be mounted in the circuit case 5. Therefore, if, for instance, the power circuit elements 1 constitute one arm in FIG. 2 and are applied to a system having two motors, twelve circuit elements 1 are required to constitute two inverter circuits, i.e. (=6×2) circuits. The twelve circuit elements 1 constituting the two inverter circuits may be fixed to a single module supporting plate 3 or may be fixed to two module supporting plates 3, in each of which with six circuit elements 1 constituting one inverter circuit may be fixed. While the foregoing description referred to three-phase inverter circuits for driving three-phase motors, it is needless to say that a two-phase inverter circuit is used for driving two-phase motors.

In the embodiment described above, when the cooling liquid 12 passes through the cooling liquid chamber 11, the back faces 15 of the module base plates come into direct contact with the cooling liquid 12. Accordingly, the power circuit elements 1 mounted on the module base plates 2 can be cooled efficiently. Moreover, because the module base plates 2 and the module supporting plate 3 are joined by the welded portions 4, there hardly occurs aging deterioration of these joint portions. Therefore, the possibility for the cooling liquid to pass these welded portions 4 and leak into the circuit case is eliminated not only at present but also in the further, so that it is possible to obtain high reliability. Further, even if the sealing member 8 arranged between the cooling case 7 and the module supporting plate 3 deteriorates over time and allows the cooling liquid 12 to leak, the cooling liquid 12 will merely leak out through a gap 16 between them but not into the circuit case 5 because the connecting part between them is positioned outside the circuit case 5. Furthermore, because the module base plates 2 are welded to the module supporting plate 3, there is no need to form fixing portions for O rings or screws or the like in the module base plates 2, and therefore it is possible to reduce the size of the module base plates 2. As a result, it is possible to restrain the cost of the module base plates which is relative expensive, and the spacing between the power circuit elements 1 can be narrowed, making it possible to reduce the size of the whole device. In addition, whereas the module base plates 2 are joined to the module supporting plate 3 by welding with a view to reducing their size, since this welding is FSW as described above, the thermal impacts on the power circuit elements 1 during the welding process can be suppressed.

Although FSW is applied to the whole circumference of the module base plates 2 in the present embodiment, if the rotary tool is subject to interference with other members and prevented from being arranged in the intended welding position, it is permissible to apply some other way of welding, such as arc welding, laser beam welding or electron beam welding, to the obstructed part alone, which may as well be joined by a non-welding method such as soldering or brazing.

Figure 3:
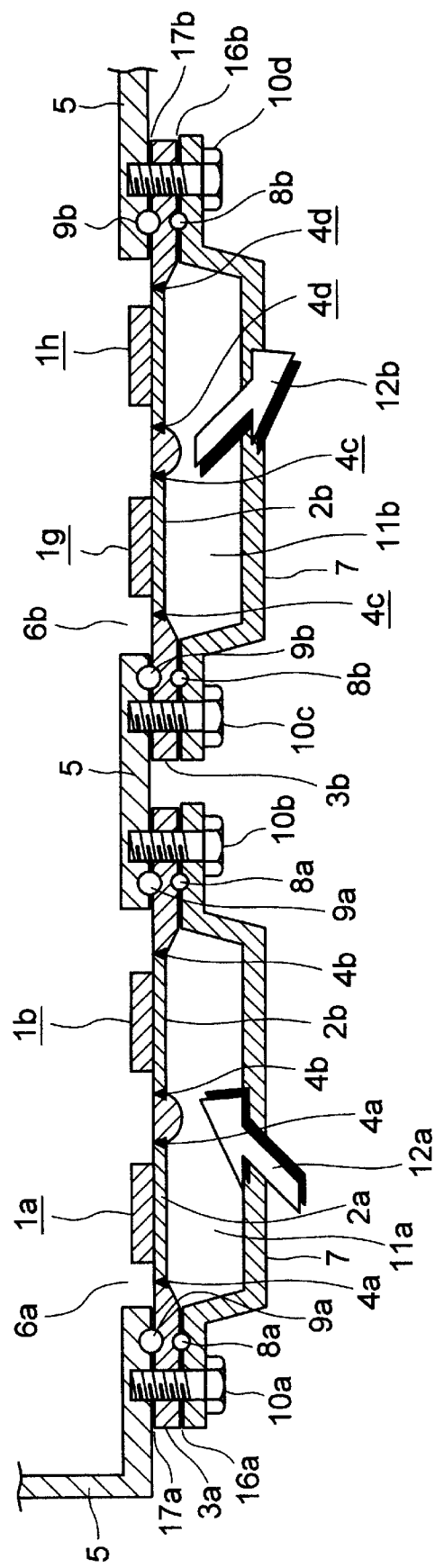
FIG. 3 is a sectional view of an essential part of a second embodiment of the liquid-cooled circuit device of the invention.

Then, a second embodiment of the liquid-cooled circuit device of the present invention will be described with reference to FIG. 3.

While the first embodiment of the invention has one module supporting plate 3 for one circuit case 5, the present second embodiment, which is a variation of the first embodiment, has a plurality of module supporting plates 3 for one circuit case 5, and substantially the same as the first embodiment with respect to other structure.

In the second embodiment, two openings 6a and 6b are formed at the bottom of the circuit case 5, and module supporting plates 3a and 3b and cooling cases 7 and 7 are fixed to the openings 6a and 6b, respectively. Cooling liquid chambers 11a and 11b in the cooling cases 7 and 7 are connected to each other in a position not shown, so that a cooling liquid 12a flowing into one cooling liquid chamber 11a in a direction normal to the surface of the paper of this drawing flow as a cooling liquid 12b out of the other cooling liquid chamber 11b. Thus, the two cooling liquid chambers 11a and 11b here are connected in series in relation to a cooling liquid supply source. It is not absolutely necessary to connect the plurality of cooling liquid chambers in series in relation to the cooling liquid supply source as in the present embodiment of the invention, but may be connected in parallel in relation to the cooling liquid supply source with the cooling efficiency of and the volume of cooling water used for the power module being duly taken into consideration.

According to the present embodiment, it is possible to attach and detach power modules to/from the circuit case 5 separately for each module supporting plate. For this reason, if a power module in any one of the module supporting plates 3 runs into trouble, the module supporting plate 3 on which the power module in trouble is mounted can be replaced, but no other module supporting plate 3 needs to be replaced.

Figure 4:
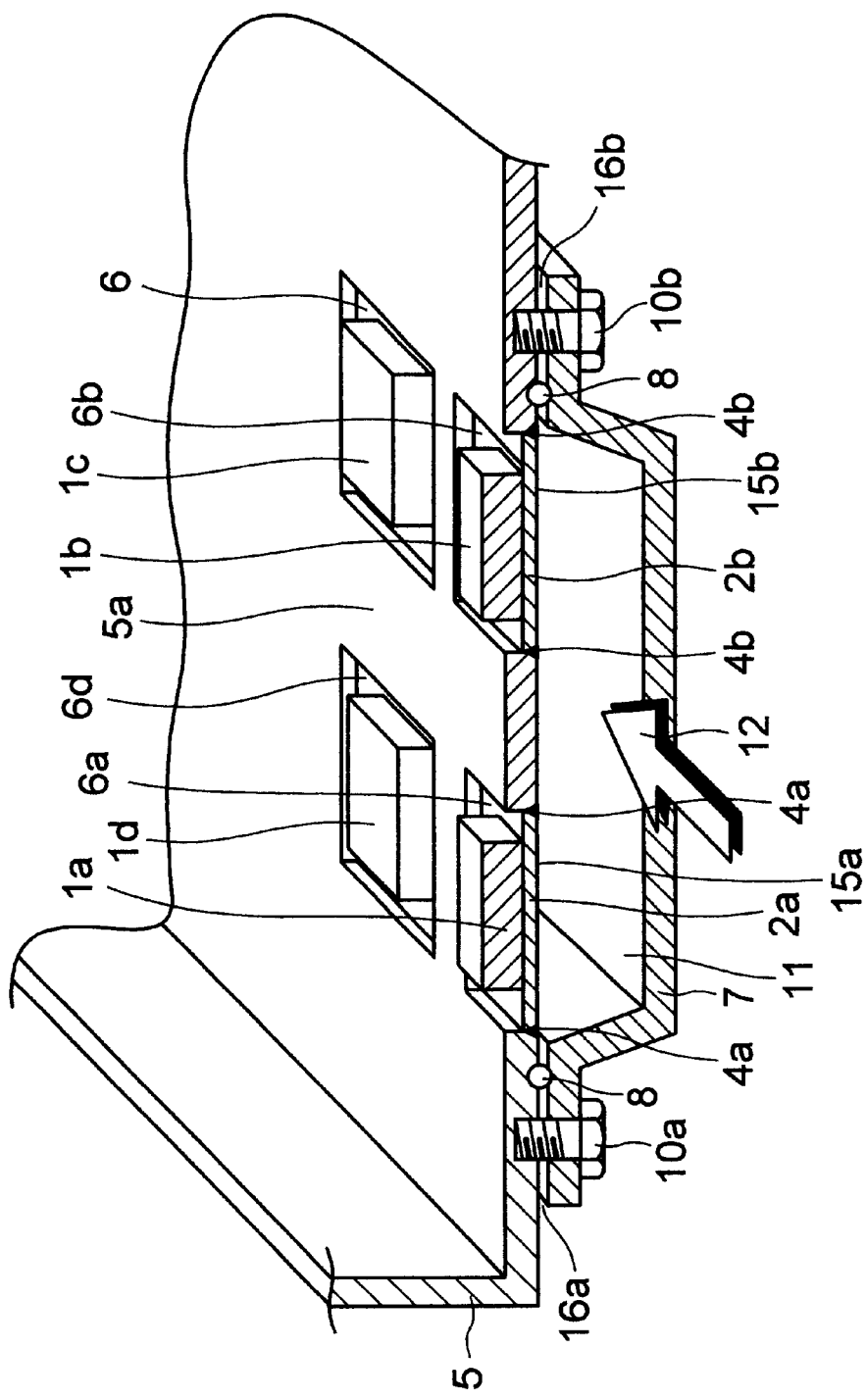
FIG. 4 is a cutout perspective view of an essential part of a third embodiment of the liquid-cooled circuit device of the invention.

Next a third embodiment of the liquid-cooled circuit device of the present invention will be described with reference to FIG. 4.

In a bottom of the circuit case 5 are formed a plurality of openings 6 as many as power modules to be mounted and matching in size to the module base plates 2. In each of the openings 6 is placed a module base plate 2 mounted with a power circuit element 1, and an outer circumference of the base plate 2 and an inner circumference of the circuit case opening 6 are welded to each other without a gap between them, and the plurality of power modules are thereby fixed to the circuit case 5. The cooling case 7 is arranged so as to cover the plurality of openings 6 in the circuit case, and fixed to the circuit case 5 with bolts 10. Between both members, a sealing member 8, such as an O ring, is inserted all around their joining portions.

In the present structure, when the cooling liquid 12 passes through the cooling liquid chamber 11, the back faces 15 of the module base plates and a portion 5a of the circuit case are efficiently cooled. Since the module base plates 2 and the circuit case 5 are fixed to each other by welding, the quality of their joining portion is not subject to deterioration due to aging. Therefore, there is no possibility for the cooling liquid to pass the welded portions 4 and leak into the circuit case 5, and high reliability can be obtained. Even if the quality of the sealing member 8 deteriorates over time and allows the cooling liquid to leak, the cooling liquid 12 will merely leak out through a gap 16 between the cooling case 7 and the circuit case 5, but never into the circuit case 5.

Furthermore, as the power modules are welded directly to the circuit case 5 in the present embodiment, the module supporting plate 3 and some of the sealing members 8 in the first embodiment can be dispensed with, and it is possible to restrain manufacturing cost. Moreover, because seal portions to be sealed by sealing members are reduced in number, reliability against cooling liquid leakage can be enhanced. Furthermore, as the portion 5a of the circuit case 5 is also cooled, if a microcomputer to be used as a control circuit is mounted in or near this portion 5a, it can be cooled, too.

While the module base plates 2 are directly welded to the edges of the openings 6 in the circuit case 5 in the present embodiment, it is also permissible to weld the module base plates 2 to the module supporting plates 3 and weld this module supporting plates 3 to the edges of the openings 6 in the circuit case 5 as in the first embodiment.

Figure 5:
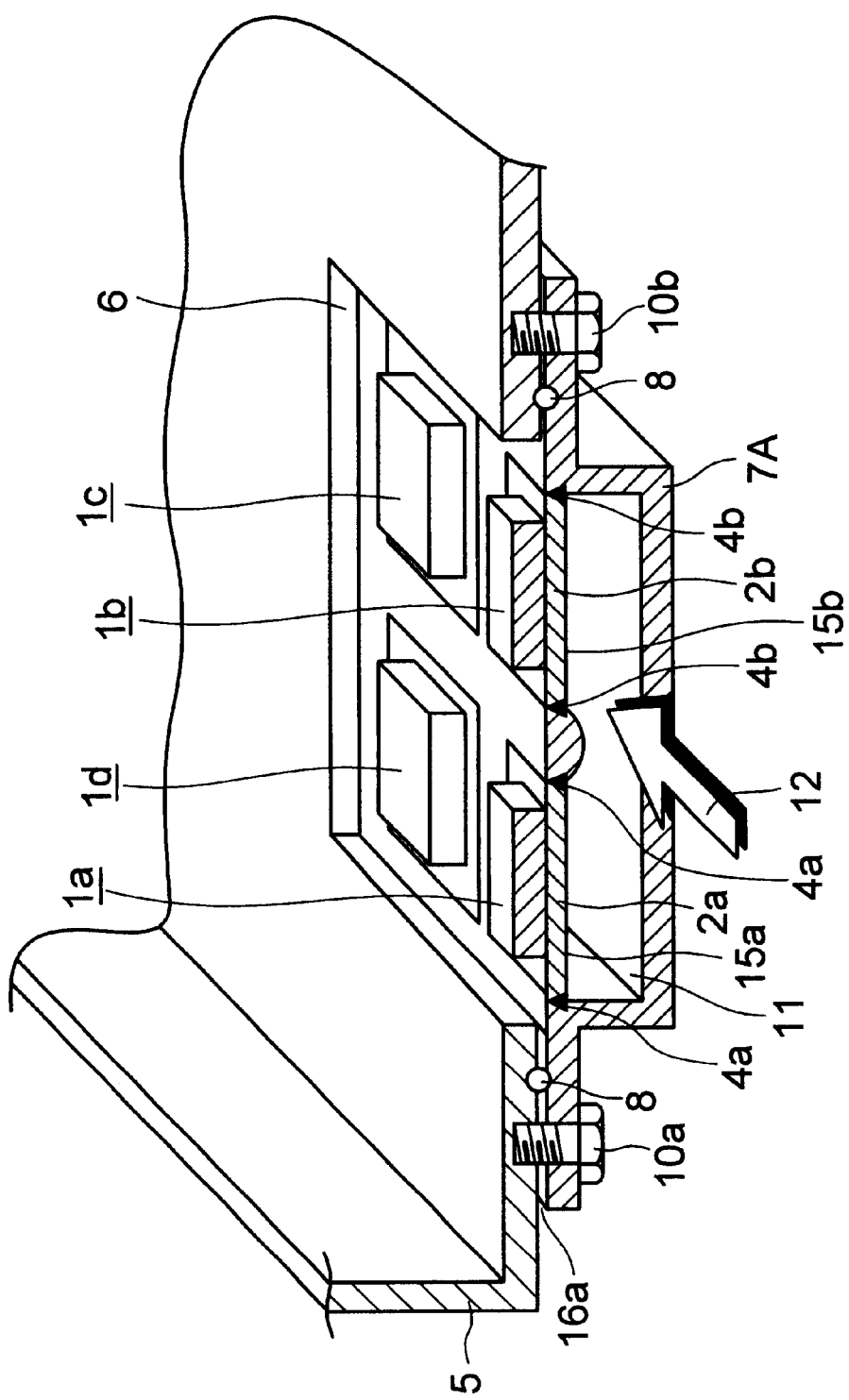
FIG. 5 is a cutout perspective view of an essential part of a fourth embodiment of the liquid-cooled circuit device of the invention.

A fourth embodiment of the liquid-cooled circuit device of the present invention will be described with reference to FIG. 5.

In the third embodiment described above, the power modules are welded to the circuit case 5, but in the present fourth embodiment, the power modules are welded to a cooling case 7A.

The cooling case 7A in the present embodiment is formed with openings penetrating into the cooling liquid chamber 11 and matching the module base plates 2 in size. The module base plates 2 are placed into the openings in the cooling case 7A, and the edges of the openings and the module base plates 2 are joined to each other by welding without a gap between them. The cooling case 7A is fixed with bolts 10 to the circuit case 5 from outside it so that the power modules are positioned within the circuit case 5 through a circuit case opening 6. Between both members, a sealing member 8, such as an O-ring, is inserted all around their joining portion (the whole circumference of the circuit case opening 6).

Also in the present structure, as in the foregoing embodiments, when the cooling liquid 12 passes through the cooling liquid chamber 11, it can efficiently cool the back faces 15 of the module base plates. Since the module base plates 2 and the cooling case 7A are fixed to each other by welding, the quality of their joining portions is not subject to deterioration due to aging. Therefore, there is no possibility for the cooling liquid to pass the welded portions 4 and leak into the circuit case 5, and high reliability can be obtained. Even if the quality of the sealing member 8 deteriorates over time and allows the cooling liquid to leak, the cooling liquid 12 will merely leak out through the gap 16 between the cooling case 7 and the circuit case 5, but never into the circuit case 5.

Furthermore, as the power modules are welded directly to the cooling case 7 in the present embodiment, the module supporting plate 3 and some of the sealing members 8 in the first embodiment can be dispensed with, and it is possible to restrain manufacturing cost. Moreover, because seal portions to be sealed by sealing members are reduced in number, reliability against cooling liquid leakage can be enhanced.

While the module base plates 2 are directly welded to the edges of the openings in the cooling case 7A in the present embodiment, it is also permissible to weld the module base plates 2 to the module supporting plates 3 and weld the module supporting plates 3 to the edges of the openings in the cooling case 7A like the first embodiment.

Figure 6:
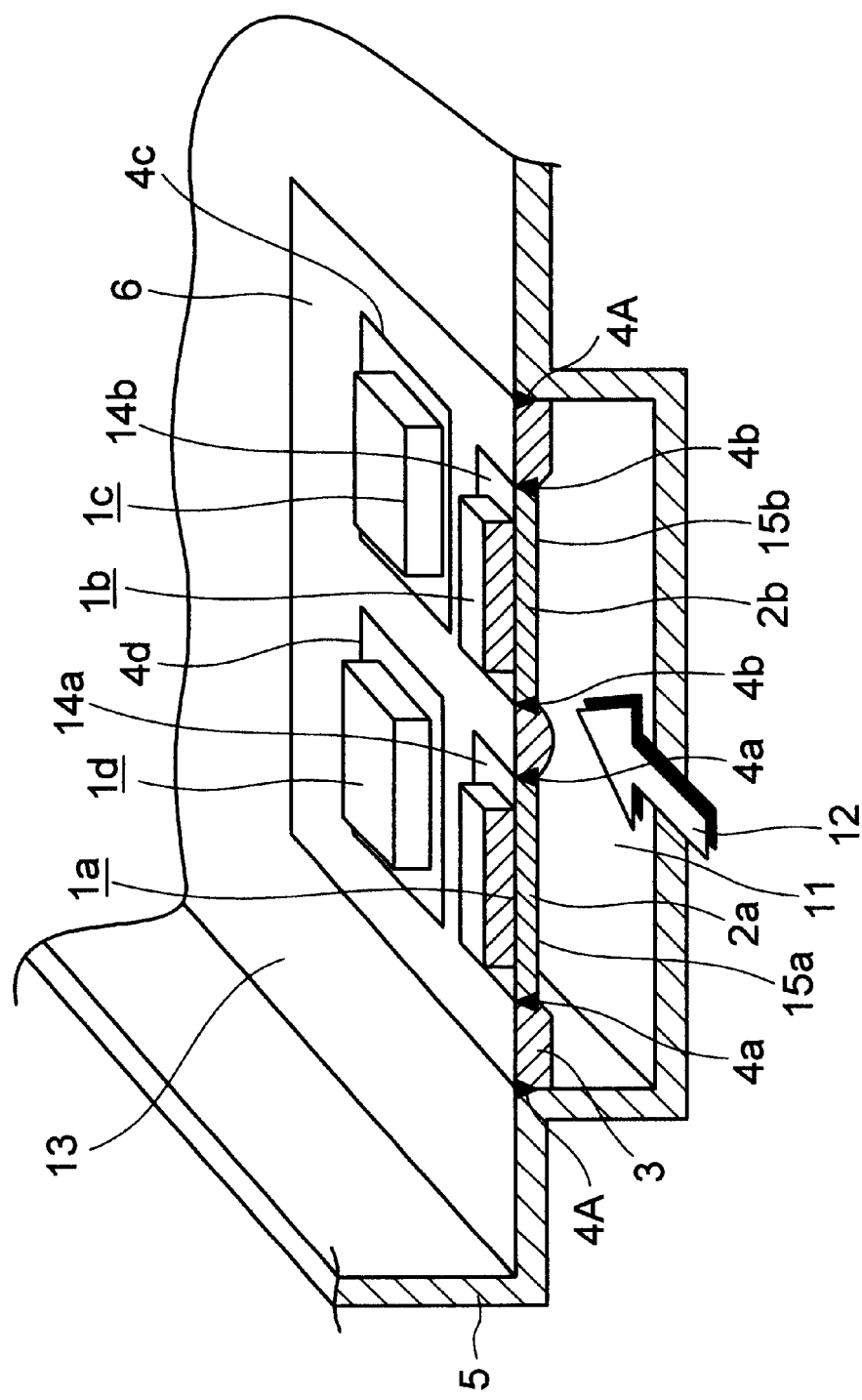
FIG. 6 is a cutout perspective view of an essential part of a fifth embodiment of the liquid-cooled circuit device of the invention.

A fifth embodiment of the liquid-cooled circuit device of the present invention will be described with reference to FIG. 6.

This embodiment uses a circuit case 5A in which the circuit case and the cooling case in the foregoing embodiments are integrated with each other. Part of the circuit case 5A is recessed from inside toward outside to form a cooling liquid chamber 11. To the opening 6 of the recess, the module supporting plate 3 mounted with power modules is joined by welding without a gap between them so that the power circuit elements 1 are positioned on the reverse side to the cooling liquid chamber 11. The inside of the circuit case 5A is divided into two chambers by the module supporting plate 3. One of the two chambers constitutes the cooling liquid chamber 11 mentioned above, and the other, a circuit accommodating chamber 13. The cooling liquid chamber 11 is provided with an inlet and an outlet for the cooling liquid, though not shown.

Because the cooling liquid chamber 11 is completely sealed in the present embodiment, the problem of possible cooling liquid leakage can be avoided. Moreover, since no sealing member whatsoever, such as an O-ring, is used, the structure is extremely simplified, and it is possible to suppress manufacturing cost.

Figure 7:
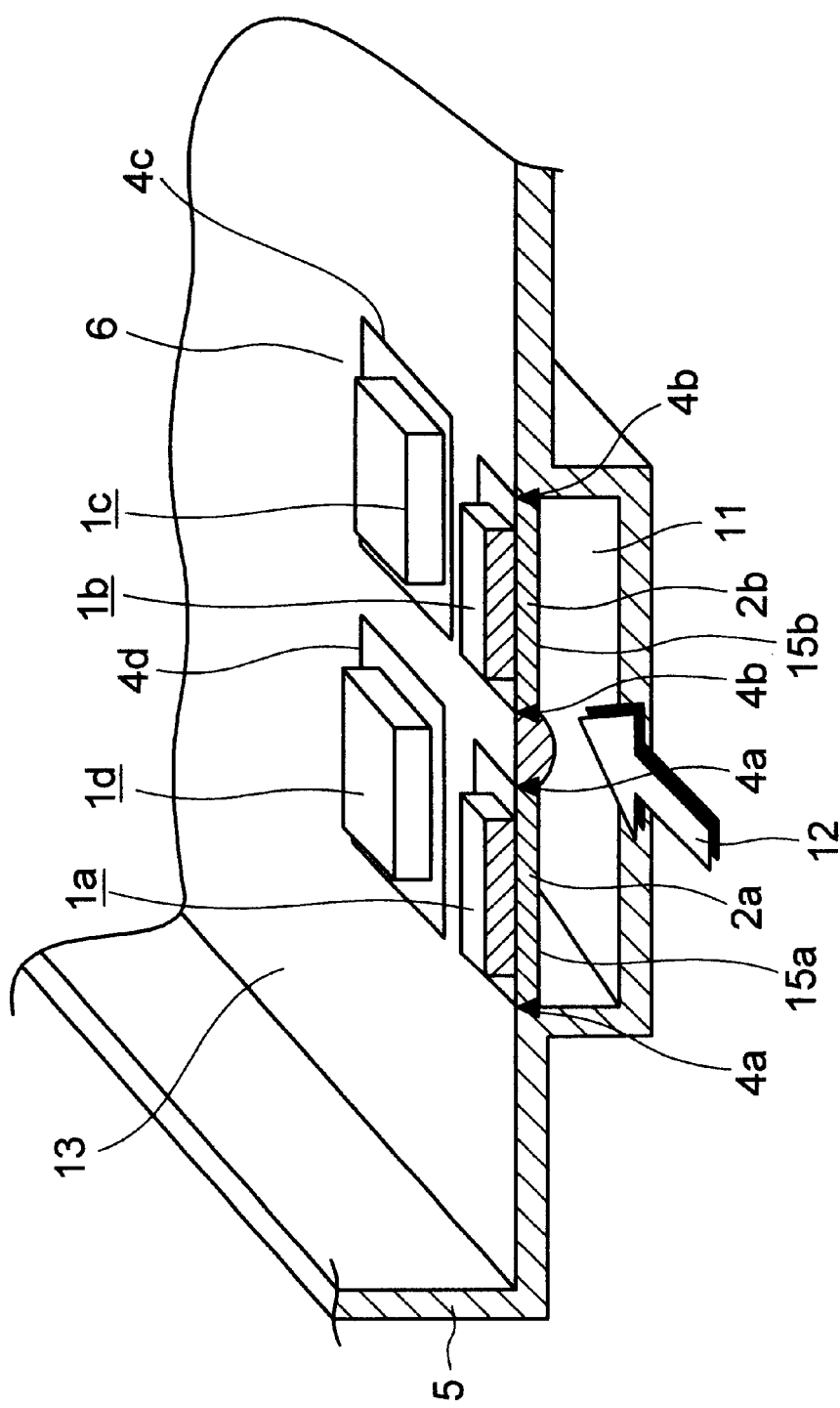
FIG. 7 is a cutout perspective view of an essential part of a sixth embodiment of the liquid-cooled circuit device of the invention.

Next, a sixth embodiment of the liquid-cooled circuit device of the present invention will be described with reference to FIG. 7.

The sixth embodiment is a variation of the fifth embodiment, and the size of the openings 6 penetrating from the circuit accommodating chamber 13 to the cooling liquid chamber 11 is matched with the size of the module base plates 2. The module base plates 2 are placed in the openings 6, and the edges of the openings 6 and the module base plates 2 are joined to each other by welding without a gap between them. In other words, in the present embodiment, the module supporting plate 3 in the fifth embodiment is dispensed with, and the module base plates 2 are directly welded to part of the inner face of the circuit case 5.

Since the present embodiment differs from the fifth embodiment basically only in the presence or absence of the module supporting plate 9, it can provide the same advantages as the fourth embodiment except that the module supporting plate 9 can be dispensed with.

Figure 8:
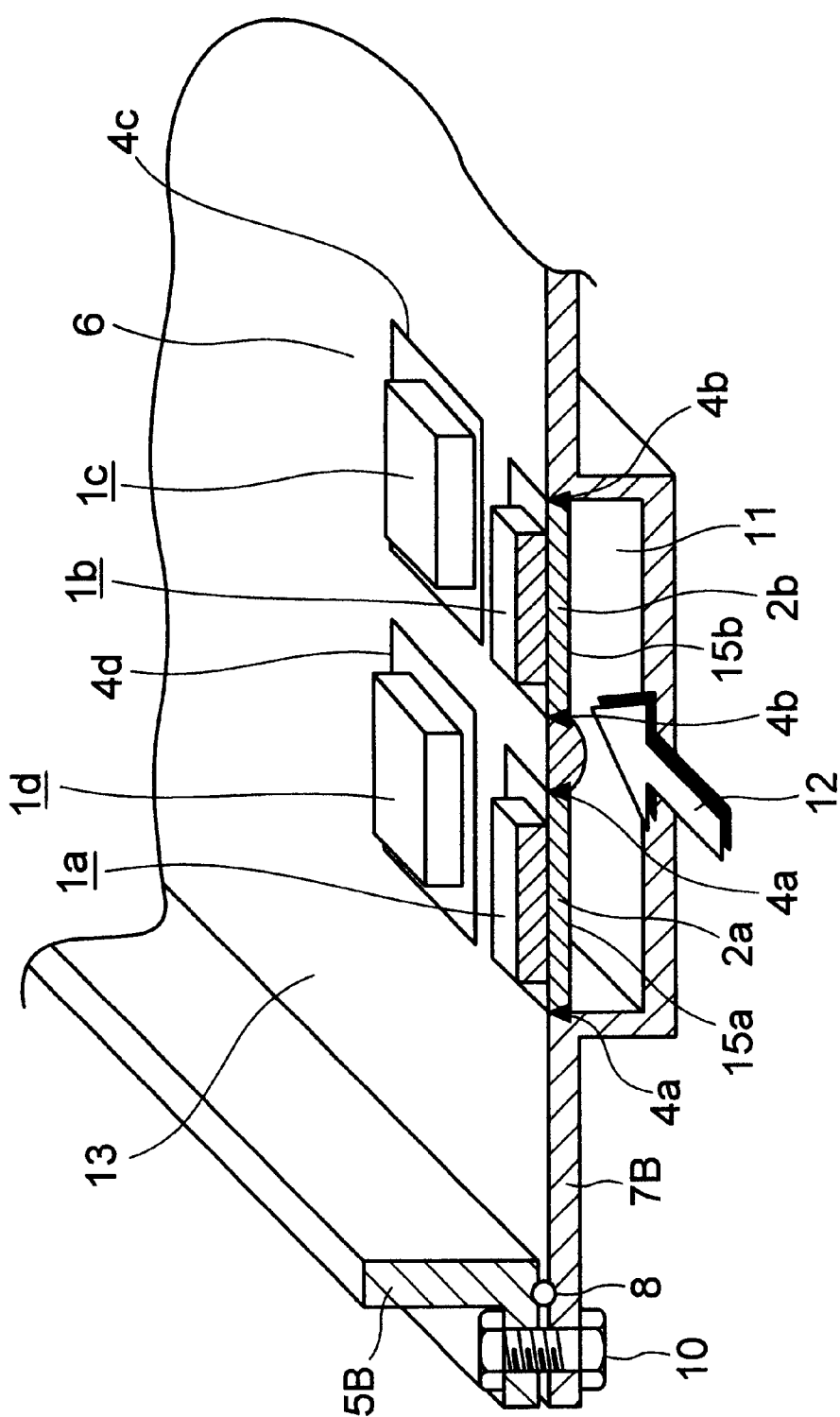
FIG. 8 is a cutout perspective view of an essential part of the seventh embodiment of the liquid-cooled circuit device of the invention.

Next, a seventh embodiment of the liquid-cooled circuit device of the present invention will be described with reference to FIG. 8.

The present embodiment is a variation of the sixth embodiment, and a circuit case 5B is divided into two parts. The present embodiment is basically similar to the fifth embodiment in all other respects. The circuit case 5B in the present embodiment comprises a cooling chamber side part 7B and the remaining part. The cooling chamber side part 7B comprises a part forming a recess to constitute the cooling liquid chamber 11 and a wall part continuous to an opening edge of the recess. The wall part and a part forming the circuit case 5B together with the wall part are connected with bolts 10, and between them is provided an O ring as the sealing member 8.

Though this bisecting of the circuit case 5B results in an increased number of parts, it facilitates the welding of power modules to the cooling chamber side part 7B, and the wiring, repair, maintenance and inspection within the circuit case 5B.

Figure 9:
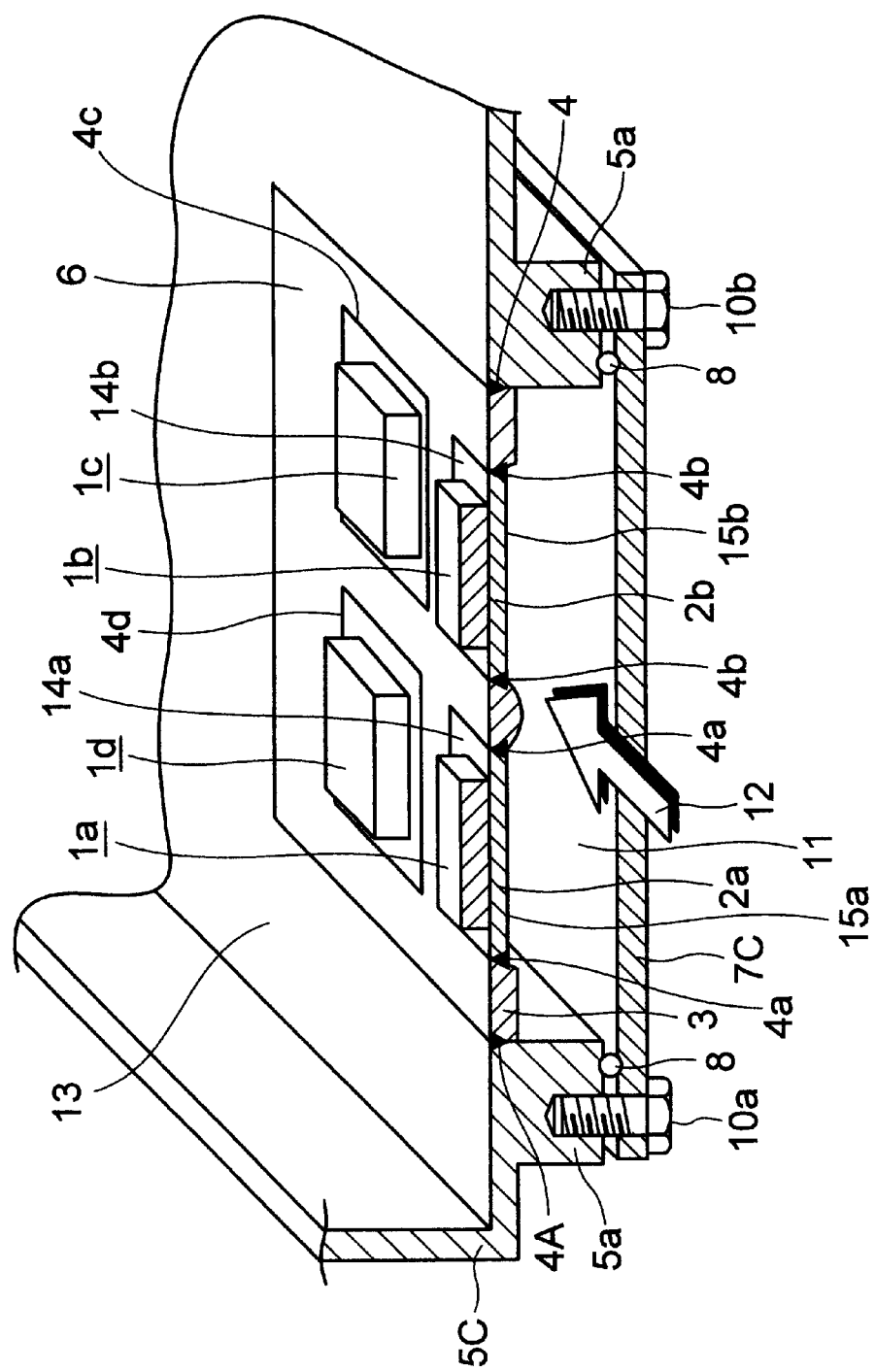
FIG. 9 is a cutout perspective view of an essential part of an eighth embodiment of the liquid-cooled circuit device of the invention.

Next, an eighth embodiment of the liquid-cooled circuit device of the present invention will be described with reference to FIG. 9.

The present embodiment is a variation of the fifth embodiment, and it is basically similar except that a cooling liquid case is bisected. The circuit case 5C in the present embodiment comprises a side wall portion for forming the cooling liquid chamber 11 together with a bottom wall 7C and a remainder portion for forming the module accommodating chamber. The bottom wall 7C is fixed to the side wall portion with bolts 10, and between them is provided an O ring as the sealing member 8.

With this structure, it is possible to easily perform the welding of the module supporting plate 3 to the circuit case 5C, and the repair, maintenance and inspection within the cooling liquid chamber 11.

To add, it should be noted that the first through fourth embodiments of the invention described above are also the same kind as the seventh and eighth embodiments in which the circuit case and the cooling case are formed from two parts.

Figure 10:
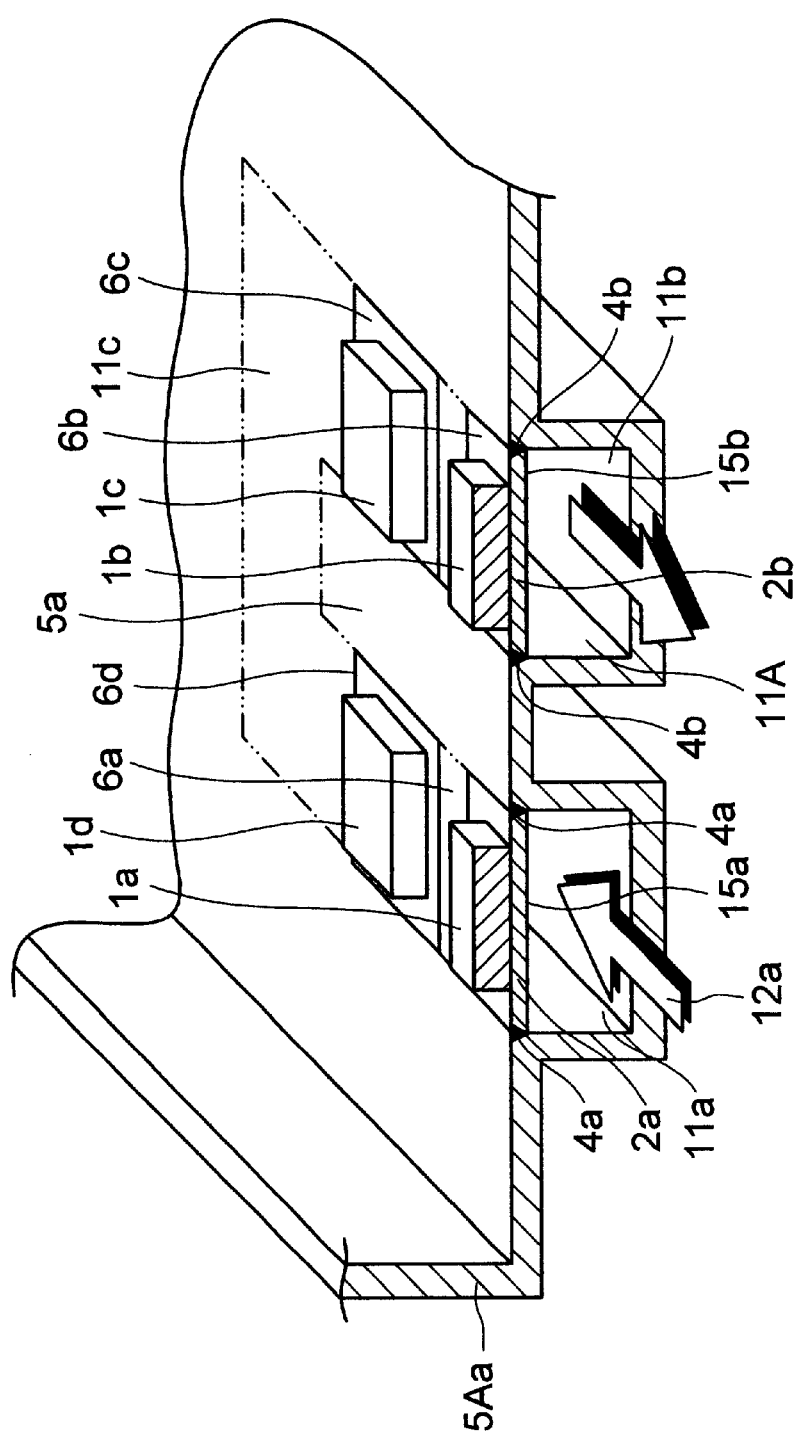
FIG. 10 is a cutout perspective view of an essential part of a ninth embodiment of the liquid-cooled circuit device of the invention.

Next, a ninth embodiment of the liquid-cooled circuit device of the present invention will be described with reference to FIG. 10.

The present embodiment is a variation of the sixth embodiment, and a channel for the cooling liquid 12 is formed so that the cooling liquid 12 comes into contact with the respective power modules in series. The present embodiment is basically similar to the sixth embodiment in all other respects. Part of the wall of the circuit case 5Aa is recessed in a U shape, and the recessed part constitutes a cooling liquid chamber 11A.

The width of openings 6 of the cooling liquid chamber 11A is substantially the same as that of the module base plates 2. The module base plates 2 are fitted into the openings 6, and joined to edges of the openings 6 without a gap between them. One end 11a of the U-shaped cooling liquid chamber 11A is connected to an inlet of cooling liquid, and the other end 11b is connected to an cooling liquid discharge port.

By narrowing the width of the cooling liquid chamber 11A as described above and thereby narrowing a sectional area of the channel for the cooling liquid 12, the flow rate of the cooling liquid 12 can be increased, and the performance of cooling the power modules can be enhanced eventually.

To add, the shape of the cooling liquid chamber 11A in the present embodiment can obviously be applied not only to the sixth embodiment but also to any other embodiments.

Figure 11:
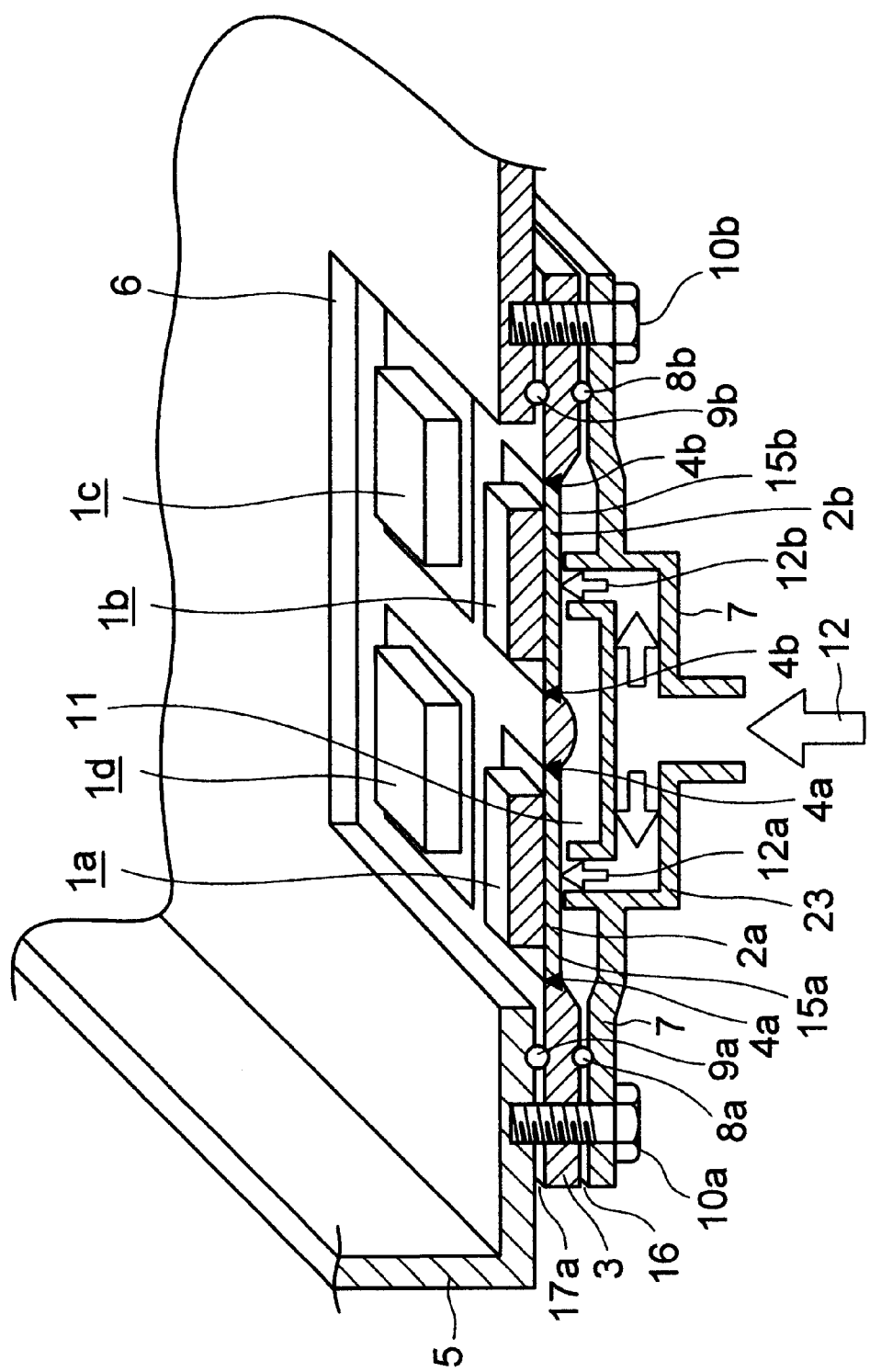
FIG. 11 is a cutout perspective view of an essential part of a tenth embodiment of the liquid-cooled circuit device of the invention.

Next, a tenth embodiment of the liquid-cooled circuit device of the present invention will be described with reference to FIG. 11.

The present embodiment invention is a variation of the first embodiment, and nozzles 23 for spraying cooling liquid 12 substantially vertical to the back faces 15a and 15b of the module base plates 2 are formed within the cooling liquid chamber 11. Its configuration is basically the same as that of the first embodiment in all other respects.

Cooling water discharge ports for discharging cooling water from the cooling water chamber 11, though not shown, are respectively provided for module base plates 2 just like the nozzles 23, and the configuration is so designed that the cooling liquid ejected from the nozzle 23 may not interfere with the cooling liquid having come into contact with the back face 15 of the module base plate 2.

To add, the shape of the cooling liquid chamber in the present embodiment of the invention can obviously be applied not only to the first embodiment but also to any other embodiments.

Figure 12:
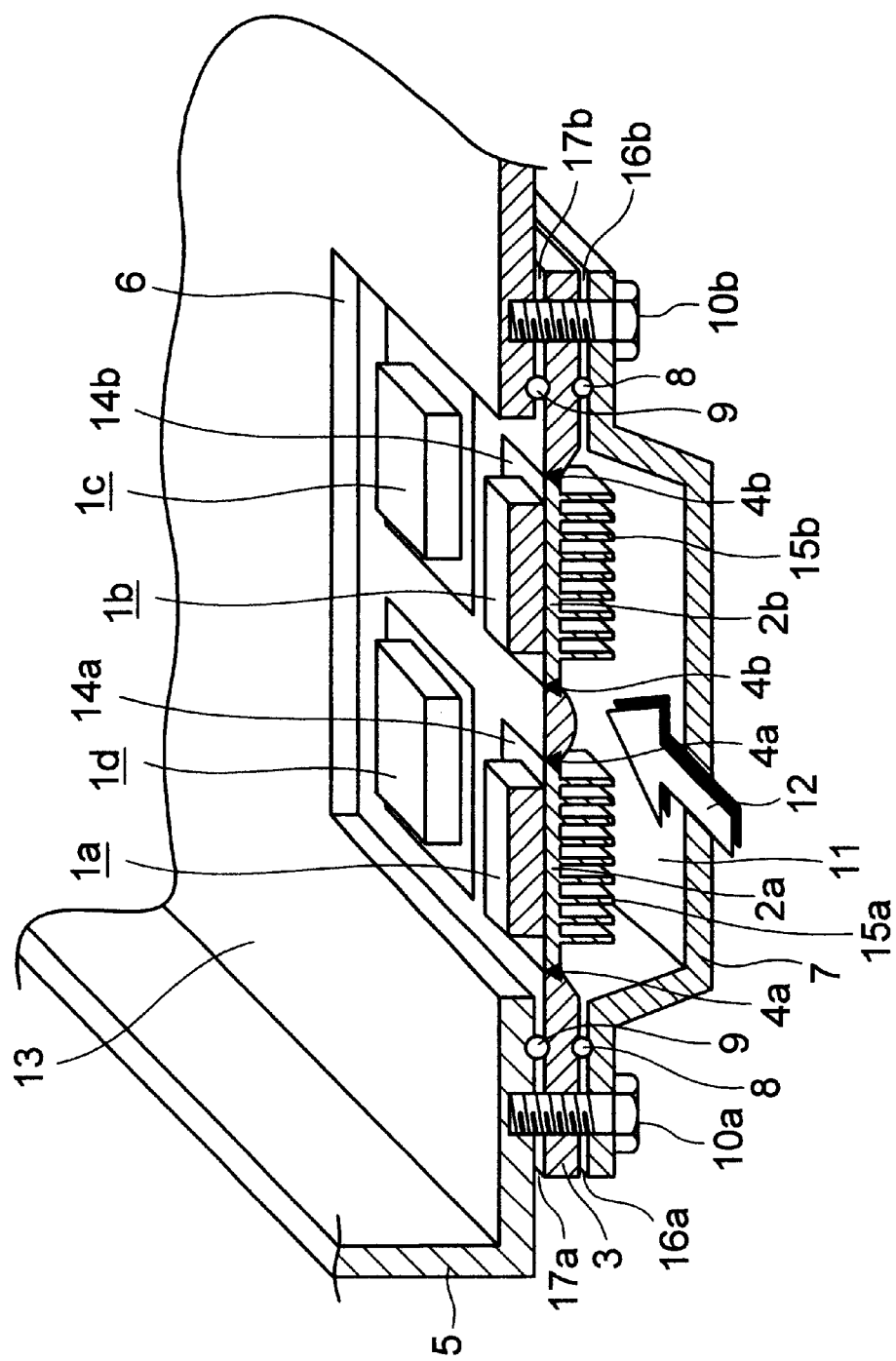
FIG. 12 is a cutout perspective view of an essential part of an eleventh embodiment of the liquid-cooled circuit device of the invention.

Next, an eleventh embodiment of the liquid-cooled circuit device of the present invention will be described with reference to FIG. 12.

The present embodiment is also another variation of the first embodiment, and pluralities of heat radiation fins are formed on the back faces 15 of the module base plates 2. The formation of such heat radiation fins expands an area of contact with cooling liquid 12 and can thereby enhance the efficiency of cooling the power modules.

Although, in the present embodiment, parallel type heat radiation fins are used, fins of some other type can be used as well. The heat radiation fins described in connection with the present embodiment can obviously be applied not only to the first embodiment but also to any other embodiments.

According to the invention, the module base plates and the mating members to be joined thereto are welded together. Therefore, it is possible to prevent the cooling liquid from infiltrating between them, and there is no need to provide portions for mounting O-rings, screws and the like to the module base plates, so that it is possible to reduce the size of the module base plates. As a result, the manufacturing cost can be reduced, and the overall size of the device can be reduced.

Furthermore, where a friction stir welding method is used for the above-described welding, the thermal impact on the circuit elements during the welding process can be minimized. A liquid-cooled circuit device comprising: a module having a circuit element and a module base plate on surface of which the circuit element is mounted; a circuit case for accommodating said module; and a cooling liquid chamber for flowing a cooling liquid in contact with a back face of said module base plate of said module, wherein said module base plate of said module is fitted into an opening provided in a member forming said cooling liquid chamber and welded without a gap.

It should be further understood by those skilled in the art that the foregoing description has been made on embodiments of the invention and that various changes and modifications may be made in the invention without departing from the spirit of the invention and the scope of the appended claims.

What is claimed is:

1. A liquid-cooled circuit device, comprising:
   a module comprising a module base plate and a circuit element mounted on the module base plate;
   a circuit case for housing the module;
   a cooling case through which cooling liquid flows, said cooling liquid being in contact with a back face of the module base plate; and
   a module supporting having an opening for accommodating the module base plate therein;
   wherein said module base plate is placed into said opening of said module supporting plate, edges of the opening and the module base plate are joined by welding to each other without a gap therebetween;
   said circuit case is formed with an opening smaller than said module supporting plate;
   said module supporting plate is fixed to the circuit case so as to block said opening in said circuit case from outside the circuit case and to cause said circuit element of said module mounted on the module supporting plate to be positioned within the circuit case;
   said cooling case is formed with a recess forming a cooling liquid chamber through which the cooling liquid flows; and
   said cooling case is fixed to said circuit case so that said recess faces said module supporting plate.

2. A liquid-cooled circuit device, comprising:
   a module comprising a module base plate and a circuit element mounted on the module base plate;
   a circuit case for housing the module; and
   a cooling case through which cooling liquid flows, said cooling liquid being in contact with a back face of the module base plate;
   wherein said circuit case is formed with an opening;
   said cooling case is formed with a recess forming a cooling liquid chamber through which said cooling liquid passes;
   the module base plate is arranged so that the circuit element of the module be positioned inside the circuit case, and joined by welding to either an edge of the opening in said circuit case or an edge of an opening of said recess of said cooling case without a gap therebetween; and
   said cooling case is fixed to the circuit case so that said recess faces toward said opening in said circuit case.

3. A liquid-cooled circuit device, comprising:
   a module comprising a module base plate and a circuit element mounted on the module base plate; and
   a circuit case for housing the module;
   wherein: the module base plate is placed within said circuit case so as to partition inside of the circuit case into two chambers, and is joined to an inner face of the circuit case by welding without a gap therebetween;
   one of the two chambers formed in said circuit case, on the side where the circuit element of the module is present, forms a circuit accommodating chamber and the other forms a cooling liquid chamber; and said cooling liquid chamber is formed with an inlet and outlet for cooling liquid flowing in contact with a back face of the module base plate of the module.

4. The liquid-cooled circuit device as claimed in claim 1, wherein said cooling case is detachably fixed to said circuit case.

5. The liquid-cooled circuit device as claimed in claim 1, wherein said cooling liquid chamber has channels formed so that said cooling liquid abuts said back faces of said module base plates substantially vertically.

6. The liquid-cooled circuit device as claimed in claim 2, wherein said cooling liquid chamber has channels formed so that said cooling liquid abuts said back faces of said module base plates substantially vertically.

7. The liquid-cooled circuit device as claimed in claim 3, wherein said cooling liquid chamber has channels formed so that said cooling liquid abuts said back faces of said module base plates substantially vertically.

8. The liquid-cooled circuit device as claimed in claim 4, wherein said cooling liquid chamber has channels formed so that said cooling liquid abuts said back faces of said module base plates substantially vertically.

9. The liquid-cooled circuit device as claimed in claim 1, wherein at least a part of welded portion between said module base plate and mating member is welded by a friction stir welding method utilizing a plastic flow due to friction heat generated by rotation of a rotary tool.

10. The liquid-cooled circuit device as claimed in claim 2, wherein at least a part of welded portion between said module base plate and mating member is welded by a friction stir welding method utilizing a plastic flow due to friction heat generated by rotation of a rotary tool.

11. The liquid-cooled circuit device as claimed in claim 3, wherein at least a part of welded portion between said module base plate and mating member is welded by a friction stir welding method utilizing a plastic flow due to friction heat generated by rotation of a rotary tool.

12. The liquid-cooled circuit device as claimed in claim 4, wherein at least a part of welded portion between said module base plate and mating member is welded by a friction stir welding method utilizing a plastic flow due to friction heat generated by rotation of a rotary tool.

13. A circuit device in which circuit elements are mounted on base plates and the base plates are fixed to other members of the circuit device, wherein said base plates and said other members are joined to each other by welding, and crystal grains in portions joined by welding are smaller than original crystal grains of the respective members.

14. A liquid-cooled circuit device comprising: a module having a circuit element and a module base plate on surface of which the circuit element is mounted; a circuit case for accommodating said module; and a cooling liquid chamber for flowing a cooling liquid in contact with a back face of said module base plate of said module, wherein said module base plate of said module is fitted into an opening provided in a member forming said cooling liquid chamber and welded without a gap.

15. The liquid-cooled circuit device as claimed in claim 14, wherein the welding of said module base plate to the opening provided in the member forming said cooling liquid chamber is accomplished via a module supporting plate.

16. The liquid-cooled circuit device as claimed in claim 14, wherein said cooling liquid chamber is formed by a recess in said circuit case isolated by said welding from said circuit case.

17. The liquid-cooled circuit device as claimed in claim 14, wherein said cooling liquid chamber is formed by said cooling case fixed in liquid-tight to said circuit case.

* * * * *